United States Patent [19]
Jenq

[11] 4,278,702
[45] Jul. 14, 1981

[54] METHOD OF MAKING PRINTED CIRCUIT BOARD BY INDUCTION HEATING OF THE CONDUCTIVE METAL PARTICLES ON A PLASTIC SUBSTRATE

[75] Inventor: Cheng-Yih Jenq, Piscataway, N.J.

[73] Assignee: Anthony J. Casella, East Williston, N.Y.; a part interest.

[21] Appl. No.: 78,687

[22] Filed: Sep. 25, 1979

[51] Int. Cl.³ ............................................. H05K 3/12
[52] U.S. Cl. .................................... 427/45.1; 427/96; 427/191; 427/192; 427/202; 427/376.7; 427/377
[58] Field of Search .................. 427/45.1, 46, 96, 191, 427/192, 282, 376.7, 377

[56] References Cited
U.S. PATENT DOCUMENTS

| 2,993,815 | 7/1961 | Treptow | 427/96 |
|---|---|---|---|
| 3,321,390 | 5/1967 | Weber | 427/96 |
| 3,410,714 | 11/1968 | Jones | 427/96 |
| 3,647,532 | 3/1972 | Friedman et al. | 427/96 |
| 3,705,819 | 12/1972 | Heller et al. | 427/45.1 |
| 3,808,046 | 4/1974 | Davey | 427/96 |
| 4,039,700 | 8/1977 | Schmer | 427/46 |
| 4,072,771 | 2/1978 | Grier | 427/96 |

FOREIGN PATENT DOCUMENTS

| 49-4057 | 1/1974 | Japan | 427/96 |
|---|---|---|---|
| 51-52416 | 5/1976 | Japan | 427/191 |
| 53-13330 | 5/1978 | Japan | 427/45.1 |
| 1374763 | 11/1974 | United Kingdom | 427/96 |
| 1499978 | 2/1978 | United Kingdom | 427/192 |
| 1555476 | 11/1979 | United Kingdom | 427/96 |

OTHER PUBLICATIONS

Goldman, "Control of Paste Spreading in Screening Process" IBM TDB vol. 19, No. 11, Apr. 1977.
Electronics, 50, No. 2, p. 144, 1-1977, "Inks for Hybrids Match Alumina".

Primary Examiner—John D. Smith
Attorney, Agent, or Firm—Anthony J. Casella; Michael A. Stallman

[57] ABSTRACT

A printed circuit board and a method of making the same is disclosed wherein a powdered conductive composition is placed on a dielectric substrate in a matrix corresponding to the desired electrical circuit pattern. The powdered conductive composition is then heated by induction so that the conductive particles are sintered to form continuous conductive pathways secured to the dielectric substrate. The use of relatively high frequency induction currents coupled with a relatively small size of the conductive particles results in rapid heating of the powdered conductive composition while leaving the underlying dielectric substrate unaffected by the induction heating.

5 Claims, 4 Drawing Figures

METHOD OF MAKING PRINTED CIRCUIT BOARD BY INDUCTION HEATING OF THE CONDUCTIVE METAL PARTICLES ON A PLASTIC SUBSTRATE

The subject invention relates to a new and improved printed circuit board and method for making the same. More particularly, the conductive circuit pattern of the printed circuit board is formed by placing a powdered, electrically conductive composition onto a dielectric substrate and thereupon heating the composition by induction for a period sufficient to sinter or fuse the particles of the conducting composition. By employing induction heating, only the electrically conductive composition, and not the dielectric substrate, becomes heated.

BACKGROUND OF THE INVENTION

It is well known in the prior art that printed circuit boards are a highly cost effective and space saving innovation when used in electrical devices. Prior to the advent of printed circuit boards, it was necessary to run individual wires between each component used in an electrical device. The advent of printed circuit board technology permitted manufacturers who repeatedly utilized the same complex circuit design in a high volume product, to eliminate the individual wiring of each component into the system, while providing an integral mechanical support for the circuitry. More particularly, a printed circuit board has numerous electrically conductive pathways imprinted on a dielectric substrate, most frequently a fiberglass reinforced phenolic or epoxy. The electrical components may then be attached to the printed circuit board with the conductive patterns on the board forming the electrical connections therebetween.

Heretofore, conventional methods of forming the electrical pathways of a printed circuit board were both expensive and time consuming. For example in one process, the dielectric substrate is coated over its entire surface with a sheet of conducting metal, such as copper or aluminum. This is generally accomplished utilizing an electroplating technique. The selected pattern or matrix, which will represent the electrical pathways between the components, is then cut into a cloth material such as silk. The cloth material, having the cut-out matrix, is then placed on the dielectric substrate which has been previously coated with the conducting material. An etch-resist ink is then rolled over the cloth, with the ink passing through the cut-out pattern and forming an inked matrix on the coated dielectric substrate. The above described method is a conventional silk screen technique. The inked and coated board is then subjected to light which causes the etch-resist ink to become acid resistant. The dielectric substrate is then treated with acid such that all the metal areas of the board not coated with the ink are etched away leaving just the matrix pattern. The ink itself may then be removed by conventional techniques thereby leaving the electrically conductive pathways formed on the printed circuit board.

In another method used in the prior art, a catalyst is placed on an uncoated dielectric substrate in the desired wiring matrix. The substrate is then immersed in a charged solution of copper ions, such that the electrical pathways are formed by electrodeposition in the areas where the catalyst was placed.

As can be seen, these methods are both time consuming and expensive. Not only are numerous steps needed to produce a printed circuit board in a conventional manner, but great amounts of conducting metal are needed for coating the entire dielectric substrate, or to provide an ionic solution.

SUMMARY OF THE INVENTION

Accordingly, it is an object of the subject invention to obviate the shortcomings of the prior art to provide a printed circuit board and a method for making the same, which is less time consuming and reduces manufacturing costs.

It is a further object of the subject invention to provide a printed circuit board and a method for making the same wherein only the conductive material needed to form the conductive pathways is placed on the dielectric substrate.

It is another object of the subject invention to provide a printed circuit board and a method for making the same wherein a powdered conductive composition is sintered or fused by induction heating, thereby forming the electrical pathways.

In accordance with these and many other objects, the subject invention provides a printed circuit board and a method of making the same wherein the first step involves the production of a patterned silk screen similar to those employed in the manufacture of the printed circuit boards of the prior art. More particularly, a silk screen is produced with a cut-out matrix defining the conductive pathways equivalent to the desired circuit pattern. The silk screen matrix is then placed directly on an uncoated dielectric substrate. At this point, a powdered conductive material or composition is rolled ont and over the silk screen matrix such that the composition is impressed onto the dielectric substrate in the pattern equivalent to the cut-out formed in the silk. The powdered conductive composition will generally consist of particles of copper or aluminum, with the individual particles having a diameter of approximately 5–10 microns. To facilitate the application of the powder onto the substrate, a wetting agent or binder is added thereto forming a paste, and in addition, an adhesive is added so that the paste will adhere to the dielectric substrate.

To transform the powdered material into conductive electrical pathways, it is necessary that the composition be heated so that the individual particles are sintered together, thereby forming a continuous electrically conductive pathway. Heating by conventional methods, such as conduction or convection, would cause the melting of not only the conducting powder, but would also deform or melt the dielectric substrate. Therefore, in accordance with the subject invention, the powdered composition is heated by induction. Induction heating is produced when a high frequency alternating current is passed through a conductive coil. The high frequency alternating current, in turn, creates a high frequency magnetic field in the area of the conductive coil. A high frequency magnetic field induces high frequency eddy currents and hysteresis currents in metals, in this case, the copper or aluminum particles. Heating of the conductive composition results from the resistance of the metal to the passage of these currents. The surface layer of the particles is heated virtually instantaneously to a depth which is inversely proportional to the square root of the frequency employed, while heating below the surface layer occurs by conduction.

Since the dielectric substrate is non-conductive, the high frequency magnetic field will not directly heat the substrate, however to prevent heating of the substrate by conduction (i.e. thermal energy transfer from the conductive composition), the induction frequency is selected such that heating time is minimized. In addition, since the required thickness of the electrical pathways is relatively thin, or the order of less than 100 microns, the mass density of the particles in the composition is relatively small, and thus comprises a low thermal inertial, thereby resulting in very rapid heating and cooling such that the conductive heat actually transferred to the substrate is minimal. Heating of the powdered electrically conductive subtrate sinters or fuses the particles thereby creating continuous electrically conductive pathways that are secured to the dielectric substrate, such that a circuit board is formed that is identical to those of the prior art, yet is produced in a fraction of the time and a reduced costs.

BRIEF DESCRIPTION OF THE DRAWINGS

Further objects and advantages of the present invention will become apparent from the following detailed description taken in conjunction with the drawings in which.

DESCRIPTION OF THE PREFERRED EMBODIMENT

Figure 1:
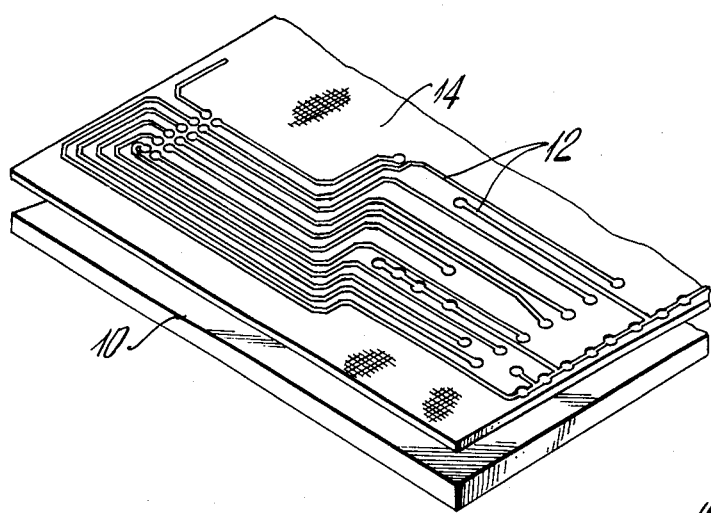
FIG. 1 is a perspective view of a silk screen having a cut-out matrix and a dielectric substrate illustrating a step in the method of forming the circuit board of the subject invention.
Figure 2:
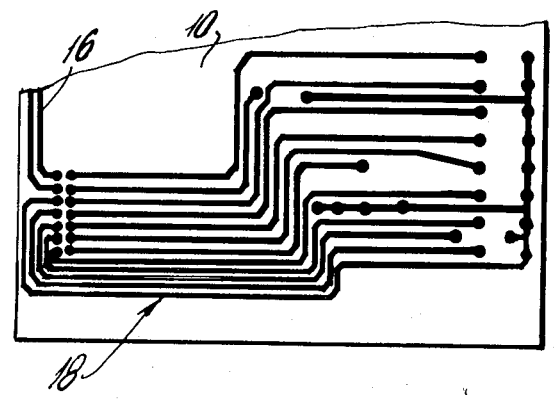
FIG. 2 is a top plan view of a dielectric substrate having the powdered conductive composition placed thereon in accordance with the subject invention.

A printed circuit board manufactured in accordance with the subject invention, and as illustrated in FIGS. 1 and 2, is formed on a conventional dielectric substrate 10. Preferably, a fiberglass reinforced polyester dielectric substrate or PCB board is utilized. A cut-out matrix pattern 12 representing the conductive paths of the circuit is formed in a cloth 14, by procedures well known in the art. Following conventional silk screening techniques, the cloth 14 is placed on the dielectric substrate 10 whereupon a powdered electrically conductive material or composition 16 is spread over the cloth 14 such that it passes through the cut-out openings to form the circuit pattern 18 on the board 10.

The powdered conductive composition 16 is composed of particles of a conducting refractory metal such as copper or aluminum. Preferably, the particles are relatively small, in the range of approximately 5-10 microns in diameter, such that rapid heating may take place thereby preventing the heating by conduction of the dielectric substrate 10. In the preferred embodiment, to facilitate the application of the powder, a paste is formed by adding a wetting agent to the composition. The particular wetting agent is chosen based on the particular type of printing method adapted. In addition, to promote the adherence of the paste to the dielectric substrate 10 an adhesive is added to the composition. The resulting composition may then be applied to the dielectric substrate 10 to form the pattern of pathways. While it is suggested that conventional silk screen techniques be used to form the circuit pattern 18 on the dielectric substrate 10, it is to be understood that any method by which the pattern is placed on the substrate such as off-set printing or the like is intended to be included within the scope of this invention. However, since silk screening techniques are commonly used in the industry, their use with the subject invention may tend to reduce manufacturing costs.

After the conductive powder 16 has been placed on the dielectric substrate 10, it must be sintered and secured to the dielectric substrate such that continuous conductive pathways are formed integral with the substrate. As was noted above, conventional heating methods are undesirable in that these methods heat both the conductive composition 16 and the dielectric substrate 10 which will warp or melt the dielectric substrate. Therefore, in accordance with the subject invention, the powdered conductive composition 16 is heated by induction.

Figure 3:
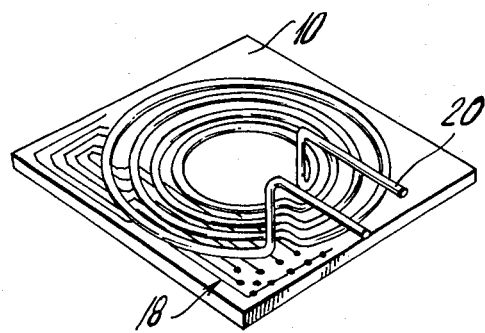
FIG. 3 represents a possible configuration of the induction heating coil in accordance with the subject invention.
Figure 4:
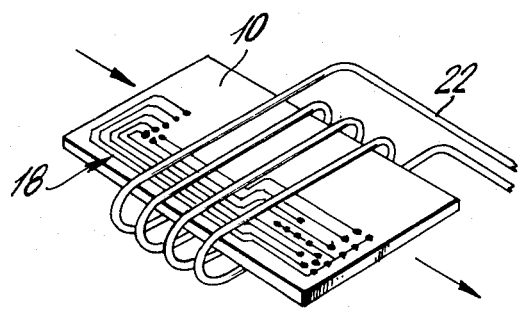
FIG. 4 illustrates another configuration of the induction heating coil as used in accordance with the subject invention.

FIGS. 3 and 4 illustrate two possible variations of induction coils which may be utilized in heating and sintering the powdered conductive composition 16. A high frequency alternating current is passed through an induction coil 20 or 22 which, in turn, creates a high frequency magnetic field. This magnetic field induces high frequency eddy currents and hysteresis currents in the metal, with the heating resulting from the resistance of the metal to the passage of these currents. Surface heating of the metal particles occurs practically instantaneously, to a depth which is inversely proportional to the square root of the frequency of the magnetic field. Heating and melting to greater depths occurs by conduction. Thus, the two primary factors which effect the heating time are the frequency of the alternating current and the size of the conductive particles. It is suggested that a frequency of approximately 22 megahertz coupled with a particulate size of approximately 5–119 microns in diameter or width will result in the sintering of the particulates in approximately 10 seconds.

As noted above, induction heating will not occur in the dielectric substrate 10, but prolonged heating of the powdered composition 16 would result in the dielectric substrate 10 being heated by conduction. However, since the metal particles are relatively small, heating time is rapid such that conductive heat transferred to the substrate is minimal.

Induction heating is generally carried out in a non-oxygen atmosphere to prevent oxidation. Therefore, it is suggested that the sintering of the conductive composition take place in a vacuum or in an atmosphere of inert gas.

As illustrated in FIG. 3, an induction coil 20 of a spiral configuration is employed. The dielectric substrate 10 is placed in close proximity to the induction coil 20 and the induction coil 20 is energized for a time period sufficient to sinter the particle. In contrast, and as illustrated in FIG. 4, the dielectric substrate is passed through the induction coil 22 at a constant rate of speed. By this arrangement, the induction coil 22 may be continuously energized, with the heating time being controlled by varying the speed at which the dielectric substrate passes through the magnetic field. It is to be understood, however, that the illustrated coil configurations are merely examples of induction heating arrangements and are not intended to limit the scope of the subject invention.

Feasibility studies were conducted in which 10 gms. of copper particles, each having a diameter of approximately 1500 microns, were heated to melt in a chilled, white iron induction heating apparatus. An alternating current with a frequency of 2.5 megahertz was utilized. Heating to melt took 19 seconds during which a temperature of 2800° F. was reached. The test data indicates that heating times in the range of 10 seconds may be readily achieved when the particle size is reduced and the frequency is increased.

Accordingly, there is provided a new and improved circuit board and a method for forming the same in which a powdered conductive composition is placed on a dielectric substrate. The powdered conductive composition is then heated by induction so that the particles are sintered together and secured to the dielectric substrate to form continuous conductive pathways. By using relatively small particles and high frequency currents, heating time is kept at a minimum so that the underlying dielectric substrate is unaffected during the heating and fusing of the conductive composition.

Although the printed circuit board and the method for forming the same have been described by a reference to preferred embodiments, it will be apparent that many other modifications could be devised by those skilled in the art that would fall within the spirit and scope of the present invention as defined by the appended claims.

What is claimed is:

1. A method of making a printed circuit board comprising the steps of:

placing a strip of powdered material onto a dielectric plastic substrate wherein said powdered material includes conductive metal particles having a melting point higher than said plastic substrate; and heating said powdered material by induction at a frequency sufficient to sinter said conductive metal particles but for a duration less than sufficient to cause said plastic substrate to deform due to the heat emitted from said metal particles and transmitted to said plastic substrate by conduction thereby securing the strip to the dielectric plastic substrate and forming a conductive pathway.

2. A method of making a printed circuit board as recited in claim 5 wherein the step of placing the strip of the powdered conductive material onto said dielectric substrate includes forming a silk screen having a cut-out corresponding to said strip, placing the silk screen on the dielectric substrate; and rolling the powdered conductive material over the silk screen thereby impressing a strip formed from the conductive material on the dielectric substrate.

3. A method of making a printed circuit board as recited in claim 1 wherein the step of sintering the powdered conductive material by induction heating is carried out in a vacuum to prevent oxidation.

4. A method of making a printed circuit board as recited in claim 1 wherein the step of sintering the powdered conductive material by induction heating is done in an atmosphere consisting of inert gas to prevent oxidation.

5. A method of making a printed circuit board as recited in claim 1 wherein a plurality of strips of powdered conductive material are placed onto said dielectric substrate prior to the step of induction heating.

* * * * *